US012188987B2

(12) United States Patent
Roth (10) Patent No.: US 12,188,987 B2
(45) Date of Patent: Jan. 7, 2025

(54) SYSTEM AND METHOD FOR PROVIDING HEARING AID RECHARGEABLE BATTERY STATE OF CHARGE ESTIMATION FOR RAPID USER FEEDBACK AND CHARGE MANAGEMENT

(71) Applicant: Team IP Holdings, LLC, Fort Worth, TX (US)

(72) Inventor: Christopher Adam Roth, Lombard, IL (US)

(73) Assignee: Team IP Holdings, LLC, Fort Worth, TX (US)

( * ) Notice: Subject to any disclaimer, the term of this patent is extended or adjusted under 35 U.S.C. 154(b) by 325 days.

(21) Appl. No.: 17/690,700

(22) Filed: Mar. 9, 2022

(65) Prior Publication Data

US 2023/0010213 A1    Jan. 12, 2023

Related U.S. Application Data

(60) Provisional application No. 63/220,692, filed on Jul. 12, 2021.

(51) Int. Cl.
*G01R 31/3842* (2019.01)
*G01R 31/36* (2020.01)
(Continued)

(52) U.S. Cl.
CPC ..... *G01R 31/3842* (2019.01); *G01R 31/3646* (2019.01); *G01R 31/371* (2019.01);
(Continued)

(58) Field of Classification Search
CPC ............ G01R 31/3842; G01R 31/3646; G01R 31/371; G01R 31/382; H02J 7/0048; H04R 25/30; H04R 2225/31
See application file for complete search history.

(56) References Cited

U.S. PATENT DOCUMENTS

2014/0254844 A1\* 9/2014 Shennib ................ H04R 25/00
  320/108
2017/0013369 A1\* 1/2017 Renken ................ H02J 7/0048
(Continued)

OTHER PUBLICATIONS

PCT International Preliminary Report on Patentability for International Application No. PCT/US2022/036833 dated Jan. 25, 2024, 7 pages.

(Continued)

*Primary Examiner* — Tung S Lau
(74) *Attorney, Agent, or Firm* — McAndrews, Held & Malloy, Ltd.

(57) ABSTRACT

Systems and methods for estimating a state of charge of a hearing aid rechargeable battery for rapid user feedback and charge management are provided. The method includes detecting a rechargeable battery of a hearing aid received at a battery charger. The method includes retrieving a last state of charge (SoC) of the rechargeable battery and a time in use of the rechargeable battery. The time in use is a time the hearing aid is out of the battery charger. The method includes estimating a current state of charge (SoC) of the rechargeable battery based on the last SoC and the time in use of the rechargeable battery. The method includes causing a display of the battery charger to present the estimated current SoC.

17 Claims, 2 Drawing Sheets

(51) Int. Cl.
  *G01R 31/371*  (2019.01)
  *H02J 7/00*  (2006.01)
  *H04R 25/00*  (2006.01)

(52) U.S. Cl.
  CPC ............ *H02J 7/0048* (2020.01); *H04R 25/30* (2013.01); *H04R 2225/31* (2013.01)

(56) References Cited

U.S. PATENT DOCUMENTS

2018/0332408 A1    11/2018  Frei et al.
2019/0075404 A1*    3/2019  Roeck .................. H04R 25/305
2019/0239005 A1     8/2019  Sandhu et al.

OTHER PUBLICATIONS

PCT International Search Report and Written Opinion of the International Search Authority for International Application No. PCT/US2022/036833 dated Oct. 24, 2022, 13 pages.

* cited by examiner

SYSTEM AND METHOD FOR PROVIDING HEARING AID RECHARGEABLE BATTERY STATE OF CHARGE ESTIMATION FOR RAPID USER FEEDBACK AND CHARGE MANAGEMENT

CROSS-REFERENCE TO RELATED APPLICATIONS/INCORPORATION BY REFERENCE

The present application claims priority under 35 U.S.C. § 119 (e) to provisional application Ser. No. 63/220,692 filed on Jul. 12, 2021, entitled "SYSTEM AND METHOD FOR PROVIDING HEARING AID RECHARGEABLE BATTERY STATE OF CHARGE ESTIMATION FOR RAPID USER FEEDBACK AND CHARGE MANAGEMENT." The above referenced provisional application is hereby incorporated herein by reference in its entirety.

FIELD

The present disclosure relates to hearing aids and personal sound amplification products. More specifically, the present disclosure relates to a system and method that provides state of charge estimation of a hearing aid rechargeable battery for rapid user feedback and charge management.

BACKGROUND

Hearing aids and similar devices, such as personal sound amplification products, have moved closer in form factor and capability to modern wearable devices. A key feature from wearables now appearing in more sound amplification devices is a rechargeable battery. With rechargeable batteries, additional ease of use features and user feedback become desirable to provide.

The primary user feedback desired with rechargeable devices is state of charge (SoC). Traditional devices, without the addition of wireless technology, do not provide up to date SoC information to a user without the device being removed from the ear and placed in a charger. Depending on battery chemistry, SoC information may not be immediately apparent from a simple voltage measurement. Accordingly, the device may communicate with a battery-specific charging integrated circuit (IC) to quantify SoC. Accurate feedback from charger ICs typically takes longer than would be acceptable to an average user. Furthermore, providing a user with timely accurate SoC information may also be confounded due to capacity degradation over the lifetime of the battery.

Further limitations and disadvantages of conventional and traditional approaches will become apparent to one of skill in the art, through comparison of such systems with some aspects of the present disclosure as set forth in the remainder of the present application.

SUMMARY

Certain embodiments of the present technology provide a system and method for estimating a state of charge of a hearing aid rechargeable battery for rapid user feedback and charge management, substantially as shown in and/or described in connection with at least one of the figures.

These and other advantages, aspects and novel features of the present disclosure, as well as details of an illustrated embodiment thereof, will be more fully understood from the following description and drawings.

DETAILED DESCRIPTION

Embodiments of the present technology provide a system and method for estimating a state of charge of a hearing aid rechargeable battery for rapid user feedback and charge management. Various embodiments provide the technical effect of quickly providing an end user with accurate state of charge (SoC) information via a mobile device communicatively coupled to a charger, without a user having to stop using the device, such as by placing the hearing aid in the charger. Certain embodiments provide the technical effect of accounting for battery capacity degradation over a life of the rechargeable battery of a hearing aid device.

The foregoing summary, as well as the following detailed description of certain embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors or memories) may be implemented in a single piece of hardware (e.g., a general-purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings. It should also be understood that the embodiments may be combined, or that other embodiments may be utilized, and that structural, logical and electrical changes may be made without departing from the scope of the various embodiments. The following detailed description is, therefore, not to be taken in a limiting sense, and the scope of the present disclosure is defined by the appended claims and their equivalents.

As used herein, an element or step recited in the singular and preceded with the word "a" or "an" should be understood as not excluding plural of said elements or steps, unless such exclusion is explicitly stated. Furthermore, references to "an exemplary embodiment," "various embodiments," "certain embodiments," "a representative embodiment," and the like are not intended to be interpreted as excluding the existence of additional embodiments that also incorporate the recited features. Moreover, unless explicitly stated to the contrary, embodiments "comprising", "including", or "having" an element or a plurality of elements having a particular property may include additional elements not having that property.

Furthermore, the term hearing aid, as used herein, refers to hearing aids customized for specific users by manufacturers and hearing care professionals, personal sound amplification products, and any suitable in-ear devices that stream audio or amplify sounds with ambient noise features. Additionally, the term processor or processing unit, as used herein, refers to any type of processing unit that can carry out the required calculations, execute algorithms, and make data-driven decisions needed for the various embodiments, such as single or multi-core: CPU, Accelerated Processing Unit (APU), Graphic Processing Unit (GPU), DSP, FPGA, ASIC or a combination thereof.

Although certain embodiments in the foregoing description may be described in reference to a hearing aid employing a rechargeable NiMH battery due to the additional complexity for determining the SoC, unless so claimed, the scope of various aspects of the present disclosure should not be limited to a hearing aid employing a rechargeable NiMH battery. Instead, any rechargeable battery chemistry may be employed with deviations only for measuring the SoC directly.

Figure 1:
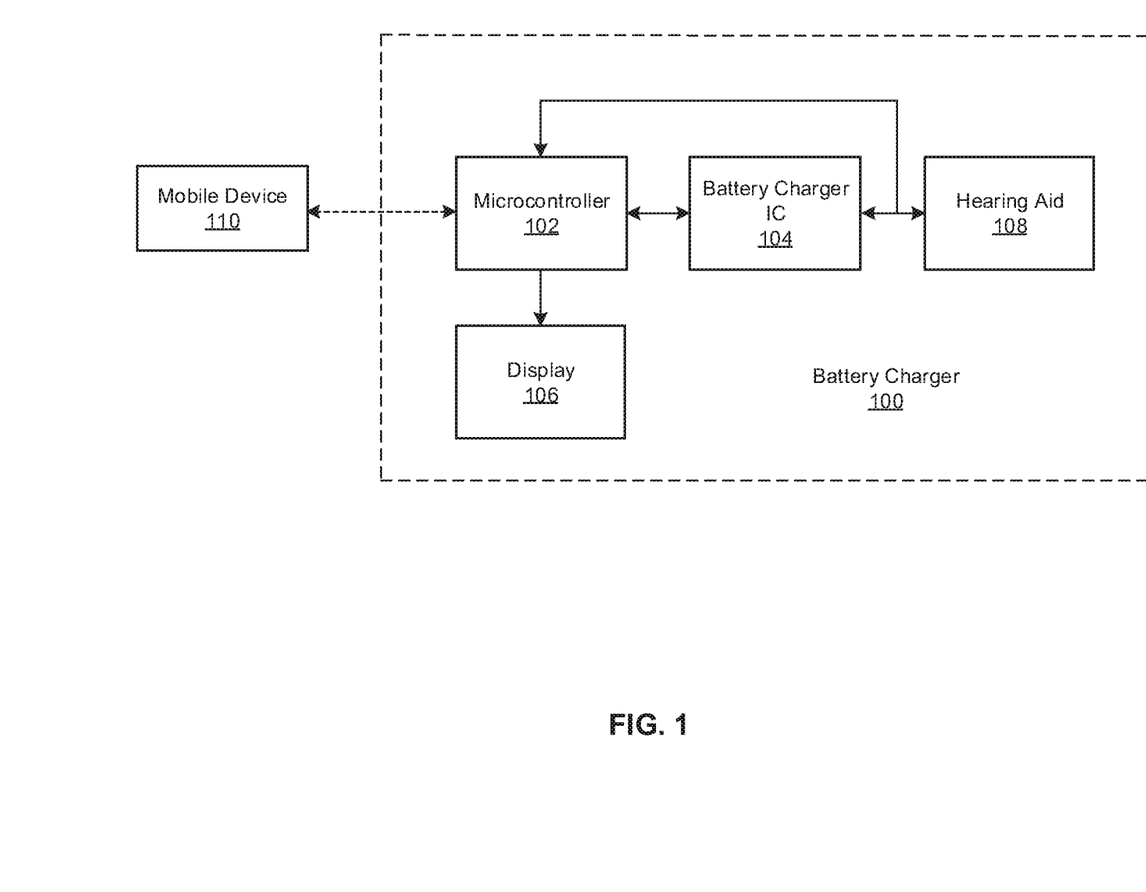
FIG. 1 is a block diagram illustrating an exemplary system for estimating a state of charge of a hearing aid rechargeable battery to provide rapid user feedback and charge management, in accordance with embodiments of the present technology.

FIG. 1 is a block diagram illustrating an exemplary system for estimating a state of charge of a hearing aid rechargeable battery to provide rapid user feedback and charge management, in accordance with embodiments of the present technology. Referring to FIG. 1, the system may comprise a battery charger 100. The battery charger 100 may be embodied in a cradle, case, or any suitable configuration. The battery charger 100 may include a microcontroller 102, a battery charger integrated circuit (IC) 104, and a display 106. The battery charger 100 may be configured to receive a hearing aid 108 having a rechargeable battery. The hearing aid 108 may be detachably coupled to the battery charger 100 to charge the rechargeable battery of the hearing aid 108. The hearing aid 108 may be removed from the battery charger 100 when in use. The hearing aid 108 may include a hearing aid customized for specific users by manufacturers and hearing care professionals, personal sound amplification products, and/or any suitable in-ear device that streams audio or amplifies sounds with ambient noise features.

The battery charger IC 104 may comprise suitable logic, circuitry, interfaces and/or code that may be operable to selectively charge a rechargeable battery of a hearing aid 108 in response to control signals received from the microcontroller 102, and provide the microcontroller 102 with battery charging information that may be applied by the microcontroller 102 to measure and/or estimate a state of charge (SoC) of the rechargeable battery of the hearing aid 108. For example, the battery charger IC 104 may be configured to receive control signals from the microcontroller 102 to selectively provide a current to the hearing aid 108 to charge the rechargeable battery of the hearing aid 108 coupled to the battery charger 100. As another example, the battery charger IC 104 may be configured to provide the microcontroller 102 with a voltage output proportional to the charge current being applied to the rechargeable battery of the hearing aid 108, which may be applied by the microcontroller 102 to measure and/or estimate the SoC of the rechargeable battery of the hearing aid 108. In various embodiments, the battery charger IC 104 may be a Linear Technology LTC4123 and/or any suitable battery charger IC 104.

The microcontroller 102 may be one or more central processing units, microprocessors, signal processors, and/or the like. The microcontroller 102 may include one or more analog-to-digital converters (not shown) configured to convert received battery voltages from the hearing aid 108 and voltages output by the battery charger IC 104 to digital signals. The microcontroller 102 may comprise one or more computer-readable memories (not shown) integrated with the microcontroller 102 and/or communicatively coupled to the microcontroller 102, such as compact storage, flash memory, random access memory, read-only memory, electrically erasable and programmable read-only memory and/or any suitable memory. The computer-readable memory may include databases, libraries, sets of information, or other storage accessed by and/or incorporated with the microcontroller 102, for example. The computer-readable memory may be able to store data temporarily or permanently, for example. The computer-readable memory may be capable of storing rechargeable battery information, data generated by the microcontroller 102, and/or instructions readable by the microcontroller 102, among other things.

The microcontroller 102 may comprise suitable logic, circuitry, interfaces and/or code that may be operable to determine an estimated SoC of a rechargeable battery of a hearing aid 108, measure an actual SoC of the rechargeable battery, and manage charging of the rechargeable battery. For example, the microcontroller 102 may be configured to estimate a SoC of a rechargeable hearing aid battery and report the estimated SoC to a user. The microcontroller 102 may report the estimated SoC via the display 106, a mobile device 110 communicatively coupled to the battery charger 100, or any suitable reporting device. For example, the microcontroller 102 may communicate wirelessly, such as via a Bluetooth connection (e.g., BLE), with a smartphone 110 executing an application configured to present the SoC estimation to a user via a display device of the smartphone 110. As another example, the microcontroller 102 may present the estimated SoC at a display 106 of the charger, such as light emitting diodes (LEDs) or any suitable display 106.

For NiMH batteries, direct measurement of the battery voltage may not be suitable for providing timely and accurate SoC measurement and estimation. The battery charger IC 104 may provide a voltage output proportional to the charge current being applied to the rechargeable battery of the hearing aid 108, which may be used by the microcontroller 102 to approximate the SoC of the rechargeable battery. However, while this voltage output is a good indicator of SoC, it may take several minutes to normalize and accurately reflect the SoC. Accordingly, various embodiments provide estimating the SoC based on a series of factors to prevent gross inaccuracy and delays in reporting the SoC.

In an exemplary embodiment, the hearing aid 108 is configured to automatically turn on when removed from the battery charger 100 such that the microcontroller 102 is aware of the time period that the hearing aid 108 has been on and in use. Thus, the microcontroller 102 is aware of the time period that the hearing aid 108 has been on and in use in order to estimate the SoC. The microcontroller 102 may be configured to estimate the SoC based on a series of factors such as, a last measured SoC level in percent of maximum capacity, an average current consumption of the hearing aid 108 in operation, an amount of time the hearing aid 108 has been out of the battery charger 100 (i.e., powered on and in operation), a number of charge cycles the rechargeable battery has been through, a capacity derating factor based on charge cycles, and/or an original maximum capacity of the rechargeable battery.

For example, the derated capacity may be determined based on the following:

Derated Capacity=(Max Capacity−(Cycle Count*Derating Factor))

The estimated SoC may be determined by the microcontroller 102 based on the following:

Estimated SoC mA=(Last SoC*Derated Capacity)−(Avg Current Draw*Time in Use)

In certain embodiments, a linear regression from max capacity to 80% of max capacity over the course of 500 charger cycles may be applied when explicit derating information in not provided by the battery manufacturer to reduce the error from capacity degradation assuming the SoC reporting uses coarse levels. Additionally and/or alternatively, more rigorous quantification of derating of a specific battery may be applied if higher accuracy or more granular SoC levels are desired.

In a representative embodiment, SoC estimation is not based on direct measurement of the current state of the SoC of the rechargeable battery while the hearing aid 108 in in use. Accordingly, the SoC estimated by the microcontroller 102 may be used to provide feedback to the user via an application executed by a communicatively coupled mobile device 110, even while a hearing aid 108 without communication capability is being used. The estimation and reporting of the SoC by the microcontroller 102 is not limited to a specific battery chemistry because estimation of the SoC is unrelated to any specific property of the battery chemistry.

The display 106 may be any device capable of communicating visual information to a user. For example, the display 106 may include light emitting diodes, a liquid crystal display, a light emitting diode display, and/or any suitable display 106.

The mobile device 110 may be a smartphone, tablet, laptop, and/or any suitable mobile device 110. The mobile device 110 may be communicatively coupled with the battery charger 100 via a wireless connection, such as a Bluetooth connection (e.g., BLE) and/or any suitable wireless connection. The mobile device 110 may comprise suitable logic, circuitry, interfaces and/or code that may be operable to execute a software application configured to present the SoC estimation to a user via a display device of the mobile device 110.

Components of the system may be implemented in software, hardware, firmware, and/or the like. The various components of the system may be communicatively linked. Components of the system may be implemented separately and/or integrated in various forms.

Figure 2:
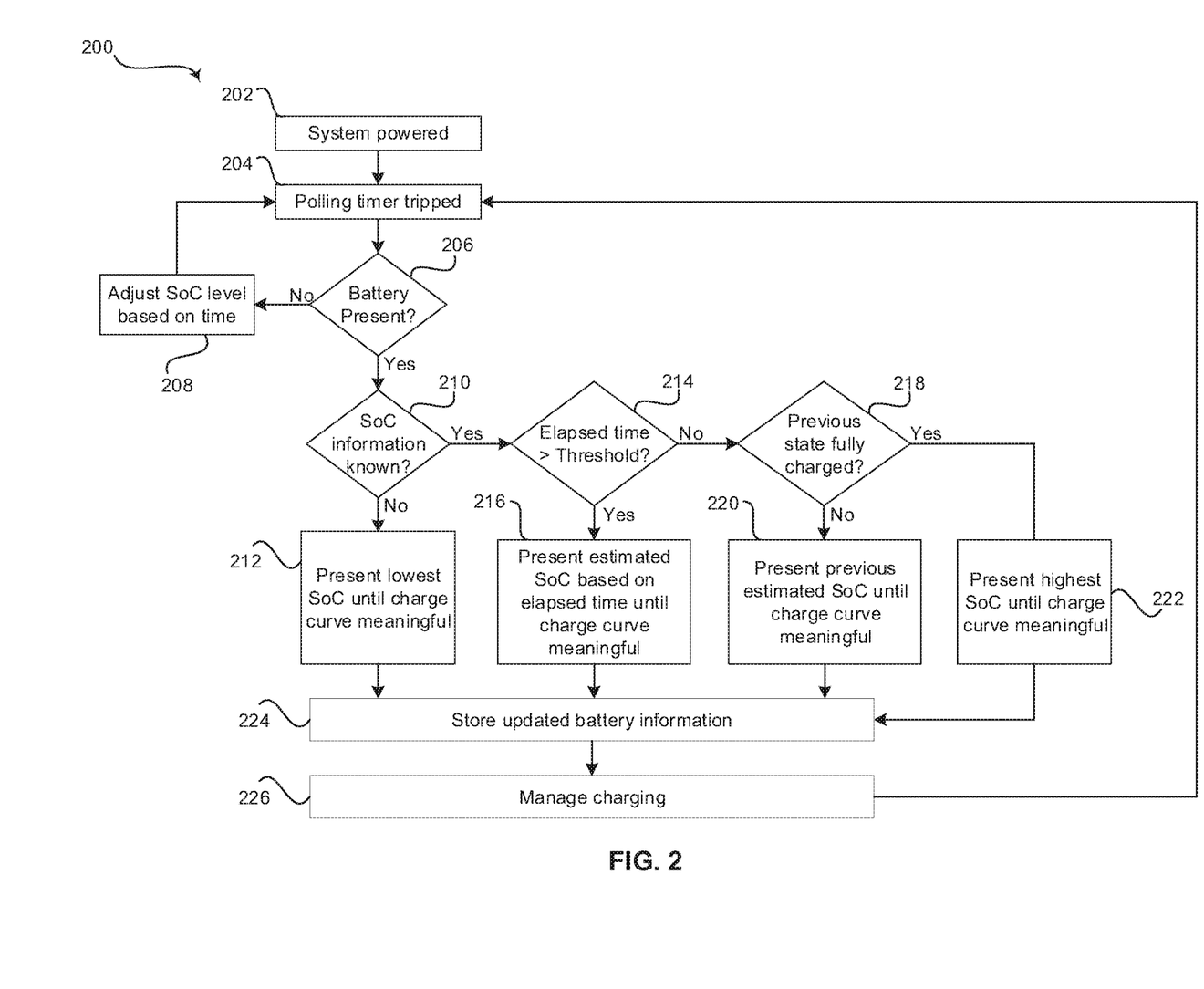
FIG. 2 is a flow diagram illustrating exemplary steps for estimating a state of charge of a hearing aid rechargeable battery to provide rapid user feedback and charge management, in accordance with embodiments of the present technology.

FIG. 2 is a flow diagram 200 illustrating exemplary steps 202-226 for estimating a state of charge of a hearing aid 108 rechargeable battery to provide rapid user feedback and charge management, in accordance with embodiments of the present technology. Referring to FIG. 2, there is shown a flow chart 200 comprising exemplary steps 202 through 226. Certain embodiments may omit one or more of the steps, and/or perform the steps in a different order than the order listed, and/or combine certain of the steps discussed below. For example, some steps may not be performed in certain embodiments. As a further example, certain steps may be performed in a different temporal order, including simultaneously, than listed below.

At step 202, a battery charger 100 is powered on. For example, the battery charger 100 may be connected to a power supply and/or a user may toggle an on/off switch on the battery charger 100.

At step 204, the battery charger 100 waits for a polling timer to trip. For example, the polling timer may trip at predetermined timing intervals, such as once per second or any suitable timing interval. The tripping of the polling timer may prompt a microcontroller 102 of the battery charger 100 to determine whether actions are ready to be performed by the battery charger 100, and if so, for the microcontroller 102 to schedule the actions.

At step 206, the microcontroller 102 of the battery charger 100 may detect whether a rechargeable battery of a hearing aid 108 is present. If a rechargeable battery of a hearing aid 108 is not present, the process proceeds to step 208. If a rechargeable battery of a hearing aid 108 is present, the microcontroller 102 may be configured to determine an identity of the rechargeable battery of the hearing aid 108 received at the battery charger 100. For example, the microcontroller 102 may identify the rechargeable battery based on serial numbers read over an inter-integrated circuit (I2C) serial communication bus, or any suitable connection, identifying a specific hearing aid 108 and therefore, the specific rechargeable battery present at the battery charger 100. The process 200 may then proceed to step 210.

At step 208, after the microcontroller 102 determines that a rechargeable battery of a hearing aid 108 is not present at the battery charger 100 at step 206, the microcontroller 102 may be configured to adjust an SoC level of a hearing aid 108 associated with the battery charger 100 based on an elapsed time since the hearing aid 108 was last removed from the battery charger 100 and the SoC level of the rechargeable battery of the hearing aid 108 when the hearing aid 108 was last removed from the battery charger 100. The elapsed time may be tracked by a timer. The adjusted SoC level may be stored at memory of the microcontroller 102. In various embodiments, the adjusted SoC level may be transmitted to a mobile device 110 communicatively coupled to the battery charger 100 for viewing access by a user. The process 200 may then return to step 204.

At step 210, after the microcontroller 102 detects a presence and identify of the rechargeable battery of the hearing aid 108 at the battery charger 100 at step 206, the microcontroller 102 may determine whether previous SoC information was stored for the rechargeable battery. If no SoC information was previously stored for the rechargeable battery of the hearing aid 108, the process proceeds to step 212. For example, SoC information may not be present at the memory of the microcontroller 102 a first time the hearing aid 108 is coupled to the battery charger 100. If SoC information corresponding with the rechargeable battery of the hearing aid 108 is present at the memory of the microcontroller 102, the process proceeds to step 214.

At step 212, the microcontroller 102 may be configured to cause a display 106 of the battery charger 100 to present a lowest level SoC if previous SoC information is not present at the memory of the microcontroller 102 as determined at step 210. For example, the microcontroller 102 of the battery charger 100 may cause the display 106 to present a lowest level SoC if the microcontroller 102 has not previously interacted with the detected serial number of the hearing aid 108 to ensure a user is not provided with an over-estimate of the SoC.

At step 214, the microcontroller 102 may be configured to determine whether an elapsed time since the hearing aid 108 was removed from the battery charger 100 exceeds a threshold amount of time. For example, the threshold amount of time may be approximately fifteen (15) minutes (i.e., 10-20 minutes). If the hearing aid 108 has been out of the battery charger 100 for an elapsed time greater than the threshold, the process 200 proceeds to step 216. If the hearing aid 108 has been removed from the battery charger 100 for an elapsed time less than the threshold, the process 200 proceeds to step 218.

At step 216, the microcontroller 102 causes the display 106 to present an estimated SoC based on the elapsed time until a charge curve is meaningful. For example, the microcontroller 102 may be configured to adjust the SoC level of the hearing aid 108 based on an elapsed time since the hearing aid 108 was last removed from the battery charger 100 and the SoC level of the rechargeable battery of the hearing aid 108 when the hearing aid 108 was last removed from the battery charger 100. The adjusted SoC level may be presented at the display 106 and stored at memory of the microcontroller 102. In various embodiments, the adjusted SoC level may be transmitted to a mobile device 110 communicatively coupled to the battery charger 100 for viewing access by a user. The microcontroller 102 may be configured to measure an actual SoC of the rechargeable battery of the hearing aid 108. For example, the microcontroller 102 may be configured to revise the SoC based on the measured voltage from the battery charger IC 104 that is proportional to the charge current indicative of the present SoC once the battery charger IC 104 has had time to normalize (i.e., the charge curve becomes meaningful). The process 200 may then proceed to step 224.

At step 218, the microcontroller 102 may be configured to determine whether the previous SoC of the rechargeable battery of the hearing aid 108 was fully charged. If the previous SoC of the rechargeable battery was not fully charged, the process 200 proceeds to step 220. If the previous SoC of the rechargeable battery was fully charged, the process 200 proceeds to step 222.

At step 220, the microcontroller 102 causes the display 106 to present the previous estimated SoC until a charge curve is meaningful if the previous SoC of the rechargeable battery was not fully charged as determined at step 218. For example, the microcontroller 102 may be configured to retrieve the previously stored SoC level of the hearing aid 108 and present the previously stored SoC level at the display 106. The microcontroller 102 may be configured to measure an actual SoC of the rechargeable battery of the hearing aid 108. As an example, the microcontroller 102 may be configured to revise the SoC based on the measured voltage from the battery charger IC 104 that is proportional to the charge current indicative of the present SoC once the battery charger IC 104 has had time to normalize (i.e., the charge curve becomes meaningful). The process 200 may then proceed to step 224.

At step 222, the microcontroller 102 may be configured to cause a display 106 of the battery charger 100 to present a highest level SoC until a charge curve is meaningful if the previous SoC of the rechargeable battery was fully charged as determined at step 218. The microcontroller 102 may be configured to measure an actual SoC of the rechargeable battery of the hearing aid 108. For example, the microcontroller 102 may be configured to revise the SoC based on the measured voltage from the battery charger IC 104 that is proportional to the charge current indicative of the present SoC once the battery charger IC 104 has had time to normalize (i.e., the charge curve becomes meaningful). The process 200 may then proceed to step 224.

At step 224, the microcontroller 102 may be configured to store the updated battery information in memory. For example, updates to the estimated SoC and/or a measured SoC based on the measured voltage from the battery charger IC 104 that is proportional to the charge current indicative of the present SoC once the battery charger IC 104 has had time to normalize may be stored by microcontroller 102 at memory.

At step 226, the microcontroller 102 may be configured to manage charging of the rechargeable battery of the hearing aid 108. The microcontroller 102 may be configured to determine an amount of time since the SoC has been measured and whether the battery charger IC 104 should begin charging the rechargeable battery of the hearing aid 108 if the battery charger 100 has previous knowledge of the hearing aid serial number. For example, the microcontroller 102 may be configured to provide a control signal to the battery charger IC 104 to begin a charge cycle if a significant amount of time has passed or the last known SoC is less than 100%. The microcontroller 102 may further be configured to start a timer to track the duration of charging and resultant increase in SoC. As another example, the microcontroller 102 may be configured to refrain from providing a control signal to the battery charger IC 104 if the hearing aid 108 has been out of the battery charger 100 for an elapsed time less than the threshold amount of time and the previous SoC was fully charged (e.g., 100 percent). Additionally, the microcontroller 102 maintains an account of the total cumulative time a given rechargeable battery of the hearing aid 108 has been under charge and uses the total cumulative time to calculate a factor to derate the battery capacity over time.

Once the hearing aid 108 has been removed from the battery charger 100, the timer used for tracking the elapsed time the hearing aid 108 is out of the battery charger 100 for SoC estimation begins and runs until the hearing aid 108 is placed back in the battery charger 100. At a same time, the microcontroller 102 continuously calculates the decreasing SoC, which may be presented at a display device of the mobile device 110 via an application executed by the mobile device 110.

Various embodiments provide a battery charger 100 (e.g., embodied as a cradle, case, or the like) having an internal microcontroller 102 and battery charging IC 104. The battery charger 100 may be configured to provide SoC estimates while the hearing device is isolated from communication interfaces. The battery charger 100 may be configured to provide intelligent charge management. The battery charger 100 may be configured to provide rapid user feedback without performing direct battery measurements. The battery charger 100 may be configured to use battery capacity derating as a factor to provide accurate SoC estimates.

Aspects of the present disclosure provide a method 200 and system 100 for estimating a state of charge of a hearing aid 108 rechargeable battery for rapid user feedback and charge management. In accordance with various embodiments, the method 200 may comprise detecting 206, by at least one processor 102 of a battery charger 100, a rechargeable battery of a hearing aid 108 received at the battery charger 100. The method 200 may comprise retrieving 214, 216, by the at least one processor 102, a last state of charge (SoC) of the rechargeable battery and a time in use of the rechargeable battery, wherein the time in use is a time the hearing aid 108 is out of the battery charger 100. The method 200 may comprise estimating 216, by the at least one processor 102, a current state of charge (SoC) of the rechargeable battery based on the last SoC and the time in use of the rechargeable battery. The method 200 may comprise causing 216, by the at least one processor 102, a display 106 of the battery charger 100 to present the estimated current SoC.

In an exemplary embodiment, the estimating 216 the current SoC is based on:

Estimated SoC=(Last SoC*Derated Capacity)−(Average Current Draw*Time in Use)

In a representative embodiment, the Derated Capacity is based on:

Derated Capacity=(Maximum Capacity−(Cycle Count*Derating Factor))

In various embodiments, the display 106 comprises light emitting diodes. In certain embodiments, the method 200 may comprise transmitting 216, by the battery charger 100, the estimated current SoC to a mobile device 110 communicatively coupled to the battery charger 100. The method 200 may comprise presenting 216, by a display device of the mobile device 110, the estimated current SoC. In an exemplary embodiment, the method 200 may comprise detecting 206, by the at least one processor 102, the rechargeable battery of the hearing aid 108 removed from the battery charger 100. The method 200 may comprise tracking 208, by the at least one processor 102, the time in use of the rechargeable battery of the hearing aid until the detecting the rechargeable battery of the hearing aid 108 received at the battery charger 100. In a representative embodiment, the method 200 may comprise determining 214, by the at least one processor 102, the time in use is less than a threshold amount of time. The method 200 may comprise determining 218, by the at least one processor 102, whether the last SoC is fully charged. The method 200 may comprise if the last SoC is fully charged, causing 222, by the at least one processor 102, the display 106 to present a highest SoC level. The method 200 may comprise if the last SoC is not fully charged, causing 220, by the at least one processor 102, the display 106 to present the last SoC.

Various embodiments provide a system 100 for estimating a state of charge of a hearing aid 108 rechargeable battery for rapid user feedback and charge management. The system may comprise a battery charger 100. The battery charger 100 may comprise at least one processor 102 and a display 106. The at least one processor 102 may be configured to detect a rechargeable battery of a hearing aid 108 received at the battery charger 100. The at least one processor 102 may be configured to retrieve a last state of charge (SoC) of the rechargeable battery and a time in use of the rechargeable battery. The time in use is a time the hearing aid 108 is out of the battery charger 100. The at least one processor 102 may be configured to estimate a current state of charge (SoC) of the rechargeable battery based on the last SoC and the time in use of the rechargeable battery. The display 106 may be configured to present the estimated current SoC.

In a representative embodiment, the at least one processor 102 is configured to estimate the current SoC based on:

Estimated SoC=(Last SoC*Derated Capacity)−(Average Current Draw*Time in Use)

In various embodiments, the Derated Capacity is based on:

Derated Capacity=(Maximum Capacity−(Cycle Count*Derating Factor))

In certain embodiments, the display 106 comprises light emitting diodes. In an exemplary embodiment, the system comprises a mobile device 110 having a display device. The mobile device 110 is wirelessly connected to the battery charger 100. In a representative embodiment, the battery charger 100 is configured to transmit the estimated current SoC to the mobile device 110. The mobile device 110 is configured to present the estimated current SoC at the display device. In certain embodiments, the at least one processor 102 is configured to detect the rechargeable battery of the hearing aid 108 removed from the battery charger 100. The at least one processor 102 is configured to track the time in use of the rechargeable battery of the hearing aid 108 until the at least one processor 102 detects the rechargeable battery of the hearing aid 108 received at the battery charger 100. In various embodiment, the at least one processor 102 is configured to determine the time in use is less than a threshold amount of time. The at least one processor 102 is configured to determine whether the last SoC is fully charged. If the last SoC is fully charged, the at least one processor 102 is configured to cause the display 106 to present a highest SoC level. If the last SoC is not fully charged, the at least one processor 102 is configured to cause the display 106 to present the last SoC.

Certain embodiments provide a non-transitory computer readable medium having stored thereon, a computer program having at least one code section. The at least one code section is executable by a machine for causing the machine to perform steps 200. The steps 200 may comprise detecting 206 a rechargeable battery of a hearing aid 108 received at a battery charger 100. The steps 200 may comprise retrieving 214, 216 a last state of charge (SoC) of the rechargeable battery and a time in use of the rechargeable battery. The time in use is a time the hearing aid 108 is out of the battery charger 100. The steps 200 may comprise estimating 216 a current state of charge (SoC) of the rechargeable battery based on the last SoC and the time in use of the rechargeable battery. The steps 200 may comprise causing 216 a display 106 of the battery charger 100 to present the estimated current SoC.

In various embodiments, the estimating 216 the current SoC is based on:

Estimated SoC=(Last SoC*Derated Capacity)−(Average Current Draw*Time in Use)

In certain embodiments, the Derated Capacity is based on:

Derated Capacity=(Maximum Capacity−(Cycle Count*Derating Factor))

In an exemplary embodiment, the steps 200 may comprise detecting 206 the rechargeable battery of the hearing aid 108 removed from the battery charger 100. The steps 200 may comprise tracking 208 the time in use of the rechargeable battery of the hearing aid 108 until the detecting 206 the rechargeable battery of the hearing aid 108 received at the battery charger 100. In a representative embodiment, the steps 200 may comprise determining 214 the time in use is less than a threshold amount of time. The steps 200 may comprise determining 218 whether the last SoC is fully charged. If the last SoC is fully charged, the steps 200 may comprise causing 222 the display 106 to present a highest SoC level. If the last SoC is not fully charged, the steps 200 may comprise causing 220 the display 106 to present the last SoC.

As utilized herein the term "circuitry" refers to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" and/or "configured" to perform a function whenever the circuitry comprises the necessary hardware and code (if any is necessary) to perform the function, regardless of whether performance of the function is disabled, or not enabled, by some user-configurable setting.

Other embodiments may provide a computer readable device and/or a non-transitory computer readable medium, and/or a machine readable device and/or a non-transitory machine readable medium, having stored thereon, a machine code and/or a computer program having at least one code section executable by a machine and/or a computer, thereby causing the machine and/or computer to perform the steps as described herein for estimating a state of charge of a hearing aid rechargeable battery for rapid user feedback and charge management.

Accordingly, the present disclosure may be realized in hardware, software, or a combination of hardware and software. The present disclosure may be realized in a centralized fashion in at least one computer system, or in a distributed fashion where different elements are spread across several interconnected computer systems. Any kind of computer system or other apparatus adapted for carrying out the methods described herein is suited.

Various embodiments may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method comprising:
   detecting, by at least one processor internal to a battery charger, a rechargeable battery of a hearing aid received at the battery charger, wherein the battery charger is embodied as a cradle or case, the battery charger having the at least one processor and a display;
   retrieving, by the at least one processor, a last state of charge (SoC) of the rechargeable battery and a time in use of the rechargeable battery, wherein the time in use is a time the hearing aid is out of the battery charger;
   estimating, by the at least one processor, a current state of charge (SoC) of the rechargeable battery based on the last SoC and the time in use of the rechargeable battery; and
   causing, by the at least one processor, the display on the battery charger to present the estimated current SoC,
   wherein the estimating the current SoC is based on:

Estimated SoC=(Last SoC*Derated Capacity)-(Average Current Draw*Time in Use).

2. The method of claim 1, wherein the Derated Capacity is based on:

Derated Capacity=(Maximum Capacity-(Cycle Count*Derating Factor)).

3. The method of claim 1, wherein the display comprises light emitting diodes.

4. The method of claim 1, comprising:
   transmitting, by the battery charger, the estimated current SoC to a mobile device communicatively coupled to the battery charger; and
   presenting, by a display device of the mobile device, the estimated current SoC.

5. The method of claim 1, comprising:
   detecting, by the at least one processor, the rechargeable battery of the hearing aid removed from the battery charger; and
   tracking, by the at least one processor, the time in use of the rechargeable battery of the hearing aid until the detecting the rechargeable battery of the hearing aid received at the battery charger.

6. The method of claim 1, comprising:
   determining, by the at least one processor, the time in use is less than a threshold amount of time;
   determining, by the at least one processor, whether the last SoC is fully charged; and
   if the last SoC is fully charged, causing, by the at least one processor, the display to present a highest SoC level; or
   if the last SoC is not fully charged, causing, by the at least one processor, the display to present the last SoC.

7. A system comprising:
   a battery charger embodied as a cradle or case, the battery charger comprising:
      at least one processor internal to the battery charger, the at least one processor configured to:
         detect a rechargeable battery of a hearing aid received at the battery charger;
         retrieve a last state of charge (SoC) of the rechargeable battery and a time in use of the rechargeable battery, wherein the time in use is a time the hearing aid is out of the battery charger; and
         estimate a current state of charge (SoC) of the rechargeable battery based on the last SoC and the time in use of the rechargeable battery; and
      a display on the battery charger, the display configured to present the estimated current SoC,
   wherein the at least one processor is configured to estimate the current SoC based on:

Estimated SoC=(Last SoC*Derated Capacity)-(Average Current Draw*Time in Use).

8. The system of claim 7, wherein the Derated Capacity is based on:

Derated Capacity=(Maximum Capacity-(Cycle Count*Derating Factor)).

9. The system of claim 7, wherein the display comprises light emitting diodes.

10. The system of claim 7, comprising a mobile device having a display device, wherein the mobile device is wirelessly connected to the battery charger.

11. The system of claim 7, wherein the at least one processor is configured to:
   detect the rechargeable battery of the hearing aid removed from the battery charger; and
   track the time in use of the rechargeable battery of the hearing aid until the at least one processor detects the rechargeable battery of the hearing aid received at the battery charger.

12. The system of claim 7, wherein the at least one processor is configured to:
   determine the time in use is less than a threshold amount of time;
   determine whether the last SoC is fully charged; and
   if the last SoC is fully charged, cause the display to present a highest SoC level; or
   if the last SoC is not fully charged, cause the display to present the last SoC.

13. The system of claim 10, wherein:
   the battery charger is configured to transmit the estimated current SoC to the mobile device; and
   the mobile device is configured to present the estimated current SoC at the display device.

14. A non-transitory computer readable medium having stored thereon, a computer program having at least one code section, the at least one code section being executable by a machine for causing the machine to perform steps comprising:
   detecting a rechargeable battery of a hearing aid received at a battery charger, the battery charger embodied as a cradle or a case, the battery charger comprising at least one processor internal to the battery charger and a display on the battery charger;
   retrieving a last state of charge (SoC) of the rechargeable battery and a time in use of the rechargeable battery, wherein the time in use is a time the hearing aid is out of the battery charger;
   estimating a current state of charge (SoC) of the rechargeable battery based on the last SoC and the time in use of the rechargeable battery; and
   causing the display on the battery charger to present the estimated current SoC,
   wherein the estimating the current SoC is based on:

Estimated SoC=(Last SoC*Derated Capacity)−(Average Current Draw*Time in Use).

15. The non-transitory computer readable medium of claim 14, wherein the Derated Capacity is based on:

Derated Capacity=(Maximum Capacity−(Cycle Count*Derating Factor)).

16. The non-transitory computer readable medium of claim 14, comprising:
   detecting the rechargeable battery of the hearing aid removed from the battery charger; and
   tracking the time in use of the rechargeable battery of the hearing aid until the detecting the rechargeable battery of the hearing aid received at the battery charger.

17. The non-transitory computer readable medium of claim 14, comprising:
   determining the time in use is less than a threshold amount of time;
   determining whether the last SoC is fully charged; and
   if the last SoC is fully charged, causing the display to present a highest SoC level; or
   if the last SoC is not fully charged, causing the display to present the last SoC.

* * * * *